US011251231B2

(12) United States Patent
Dai et al.

(10) Patent No.: US 11,251,231 B2
(45) Date of Patent: Feb. 15, 2022

(54) PIXEL ARRANGEMENT STRUCTURE, ORGANIC LIGHT EMITTING DIODE DISPLAY PANEL, DISPLAY DEVICE AND MASK PLATE ASSEMBLY

(71) Applicants: Chengdu BOE Optoelectronics Technology Co., Ltd., Sichuan (CN); BOE TECHNOLOGY GROUP CO., LTD., Beijing (CN)

(72) Inventors: Weinan Dai, Beijing (CN); Yang Wang, Beijing (CN); Yangpeng Wang, Beijing (CN); Benlian Wang, Beijing (CN); Haijun Yin, Beijing (CN); Haijun Qiu, Beijing (CN); Yao Hu, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/477,515

(22) PCT Filed: Dec. 17, 2018

(86) PCT No.: PCT/CN2018/121464
§ 371 (c)(1),
(2) Date: Jul. 11, 2019

(87) PCT Pub. No.: WO2019/134495
PCT Pub. Date: Jul. 11, 2019

(65) Prior Publication Data
US 2019/0355794 A1 Nov. 21, 2019

(30) Foreign Application Priority Data
Jan. 2, 2018 (CN) .......................... 201810002818.5

(51) Int. Cl.
*H01L 27/32* (2006.01)
(52) U.S. Cl.
CPC ...... *H01L 27/3218* (2013.01); *H01L 27/3216* (2013.01)
(58) Field of Classification Search
CPC ...................... H01L 27/3218; H01L 27/3216
See application file for complete search history.

(56) References Cited

U.S. PATENT DOCUMENTS 9,818,803 B2    11/2017  Lee
9,905,762 B2    2/2018   Wang
(Continued)

FOREIGN PATENT DOCUMENTS

CN    104898369 A    9/2015
CN    105206647 A    12/2015
(Continued)

OTHER PUBLICATIONS

Chinese Office Action dated Jun. 19, 2018, from application No. 201820003601.1.
(Continued)

*Primary Examiner* — Peniel M Gumedzoe
(74) *Attorney, Agent, or Firm* — Thomas | Horstemeyer, LLP

(57) ABSTRACT

A pixel arrangement structure, an organic light emitting diode display panel, a display device and a mask plate assembly are disclosed in the disclosure. The pixel arrangement structure includes a plurality of first sub-pixels, a plurality of second sub-pixels, a plurality of third sub-pixels. The positions of the sub-pixels are not overlapped with each other. One of the plurality of first sub-pixels is located at the center position of a first virtual rectangle. Four of the plurality of first sub-pixels are located at four vertex angle positions of the first virtual rectangle, respectively. Four of
(Continued)

the plurality of second sub-pixels are located at the center positions of four sides of the first virtual rectangle, respectively. The first virtual rectangle is divided into four second virtual rectangles, and the inside of each of the four second virtual rectangles comprises one third sub-pixel of the plurality of third sub-pixels.

20 Claims, 12 Drawing Sheets

(56) References Cited

U.S. PATENT DOCUMENTS

| | | | |
|---|---|---|---|
| 10,147,771 | B2 | 12/2018 | Jung |
| 2013/0234917 | A1 | 9/2013 | Lee |
| 2015/0102320 | A1 | 4/2015 | Jung |
| 2015/0200237 | A1* | 7/2015 | Yim .................... H01L 27/3248 257/40 |
| 2016/0291410 | A1* | 10/2016 | Lee ..................... G02F 1/13439 |
| 2017/0278905 | A1 | 9/2017 | Hsu et al. |
| 2017/0288142 | A1 | 10/2017 | Wang |
| 2017/0317145 | A1 | 11/2017 | Hong et al. |
| 2018/0069057 | A1 | 3/2018 | Lee |
| 2018/0190752 | A1* | 7/2018 | An ..................... H01L 27/3265 |

FOREIGN PATENT DOCUMENTS

| | | |
|---|---|---|
| CN | 204885166 U | 12/2015 |
| CN | 107340905 A | 11/2017 |
| CN | 207966982 U | 10/2018 |
| CN | 207966983 U | 10/2018 |
| CN | 207966984 U | 10/2018 |
| CN | 207966985 U | 10/2018 |
| CN | 207966986 U | 10/2018 |
| CN | 207966987 U | 10/2018 |
| CN | 207966994 U | 10/2018 |
| CN | 207966995 U | 10/2018 |
| EP | 2 637 209 A1 | 9/2013 |
| EP | 2 637 209 B1 | 9/2013 |
| EP | 3236463 A1 | 10/2017 |
| EP | 2 637 209 B1 | 5/2018 |
| KR | 20140035239 A | 3/2014 |
| KR | 20140127690 A | 11/2014 |
| KR | 20160015203 A | 2/2016 |
| KR | 101700558 B1 | 1/2017 |

OTHER PUBLICATIONS

International Search Report and Written Opinion dated Mar. 25, 2019, for application No. PCT/CN2018/121464.
Extended European Search Report for EP Patent Application No. 18898554.3 dated Sep. 10, 2021.
First Office Action for Korean Patent Application No. 1020207022198 dated Nov. 27, 2021

* cited by examiner

PIXEL ARRANGEMENT STRUCTURE, ORGANIC LIGHT EMITTING DIODE DISPLAY PANEL, DISPLAY DEVICE AND MASK PLATE ASSEMBLY

CROSS REFERENCE

The present application is a continuing application of International Application No. PCT/CN2018/121464, filed on Dec. 17, 2018, which is based upon and claims priority to Chinese Patent Application No. 201810002818.5, filed on Jan. 2, 2018, and the entire contents thereof are incorporated herein by reference.

TECHNICAL FIELD

The present disclosure relates to the field of display technologies, and in particular, to a pixel arrangement structure, an organic light emitting diode display panel, a high precision metal mask plate assembly, and a display device.

BACKGROUND

Organic Light Emitting Diode (OLED) display means is one of the hotspots in the research field of the flat panel displays nowadays. Compared with the liquid crystal display, OLED display means can provide low power consumption, low production cost, self-illumination, wide viewing angle and fast response. At present, OLED display means has begun to replace the traditional liquid crystal display (LCD) in the field of the flat panel display, such as mobile phone, PDA, and digital camera, etc.

The structure of the OLED display means mainly includes a base substrate, sub-pixels that are manufactured on the base substrate and arranged in a matrix. Among them, each sub-pixel is generally to form an organic light emitting diode structure at a corresponding sub-pixel position on the array substrate through an organic material penetrating a high precision metal mask plate by using evaporation film formation technology.

However, in the current OLED display means, the sub-pixel opening area in the pixel arrangement structure is smaller, thereby it is necessary to increase the drive current to satisfy the brightness requirement of the display. However, OLED operating under a large drive current are easily leaded to an increase of the aging speed of the means, thereby shortening the lifetime of the OLED display means.

SUMMARY

According to one aspect of the present disclosure, a pixel arrangement structure is provided in the arrangement of the present disclosure. The pixel arrangement structure includes a plurality of first sub-pixels, a plurality of second sub-pixels, and a plurality of third sub-pixels. The positions of the all above sub-pixels are not overlapped with each other. One of the plurality of first sub-pixels is located at the center position of a first virtual rectangle, and four of the plurality of first sub-pixels are located at four vertex angle positions of the first virtual rectangle respectively. Four of the plurality of second sub-pixels are located at the center positions of four sides of the first virtual rectangle, respectively. The first virtual rectangle is divided into four second virtual rectangles, and the inside of each of the four second virtual rectangles each comprises one third sub-pixel of the plurality of third sub-pixels.

In one arrangement of the present disclosure, the second virtual rectangle is formed by sequentially connecting four vertex angles, and the four vertex angles comprise two second sub-pixels and two first sub-pixels. The two second sub-pixels are located at the center positions of two adjacent sides of the first virtual rectangle. Each of the two first sub-pixels is adjacent to each of the two second sub-pixels. One of the two first sub-pixels is located at the center position of the first virtual rectangle, and the other is located at a vertex angle position of the first virtual rectangle.

In one arrangement of the present disclosure, each of the plurality of third sub-pixels is in a long strip shape. The extension direction of the long strip shape is a direction which is away from the center of the first virtual rectangle.

In one arrangement of the present disclosure, the extension direction of each third sub-pixel inside of the four second virtual rectangles is different. The extension direction of each third sub-pixel inside of the four second virtual rectangles is a direction which is away from the first sub-pixel located at the center of the first virtual rectangle and extending in the corresponding second virtual rectangle.

In one arrangement of the present disclosure, the long strip shape is a mirror symmetrical view in the direction perpendicular to the extension direction thereof. In one arrangement of the present disclosure, the extension directions of the third sub-pixels in the two second virtual rectangles which disposed along a diagonal of the first virtual rectangle are consistent.

The first virtual rectangle is provided with a first diagonal line and a second diagonal line. The third sub-pixels in the two second virtual rectangles which disposed along the first diagonal line are extended in a direction along the first diagonal line. The third sub-pixels in the two second virtual rectangles which disposed along the second diagonal line are extended in a direction along the second diagonal line.

The third sub-pixels in the two second virtual rectangles which disposed along the first diagonal line are mirror symmetry with respect to the second diagonal line. The third sub-pixels in the two second virtual rectangles which disposed along the second diagonal line are mirror symmetry with respect to the first diagonal line.

In one arrangement of the present disclosure, there is a first ratio between the minimum distance which is between the opposite sides of the third sub-pixel and the adjacent first sub-pixel, and the minimum distance which is between the opposite sides of the third sub-pixel and the adjacent second sub-pixel. There is a second ratio between the minimum distance which is between the opposite sides of the third sub-pixel and the adjacent first sub-pixel, and the minimum distance which is between the opposite sides of the first sub-pixel and the adjacent second sub-pixel. There is a third ratio between the minimum distance which is between the opposite sides of the third sub-pixel and the adjacent second sub-pixel, and the minimum distance which is between the opposite sides of the first sub-pixel and the adjacent second sub-pixel. The first ratio, the second ratio and the third ratio are each in the range of 0.8-1.2.

In one arrangement of the present disclosure, the first ratio, the second ratio, and the third ratio are equal.

the ratio of the maximum distance between the opposite sides of the third sub-pixel and the adjacent first sub-pixel to the minimum distance between the opposite sides of the third sub-pixel and the adjacent first sub-pixel is in a range of 1-1.5. The ratio of the maximum distance between the opposite sides of the third sub-pixel and the adjacent second sub-pixel to the minimum distance between the opposite sides of the third sub-pixel and the adjacent second sub-pixel is in a range of 1-1.5.

In one arrangement of the present disclosure, the first ratio, the second ratio, and the third ratio are each equal to 1.

In one arrangement of the present disclosure, the opposite sides of the third sub-pixel and the adjacent first sub-pixels are parallel to each other. The opposite sides of the third sub-pixel and the adjacent second sub-pixels are parallel to each other.

In one arrangement of the present disclosure, the shape of the first sub-pixel is a substantial cruciform. Each inner angle of the first sub-pixel is greater than or equal to 90 degrees. The cruciform is a shape formed by concave of the middle of four sides of a quadrilateral. The four vertex angles of the quadrilateral are as four ends of the cruciform respectively. The quadrilateral is a substantial rhombus or a substantial square.

In one arrangement of the present disclosure, two ends of the long strip shape are circular arcs or polygons that protrude outward from the interior of the long strip shape.

In one arrangement of the present disclosure, at least one of the shape of the second sub-pixel and the first sub-pixel is a substantial rectangle.

In one arrangement of the present disclosure, the first sub-pixel is a red sub-pixel; the second sub-pixel is a blue sub-pixel; the third sub-pixel is a green sub-pixel. The area of the blue sub-pixel is larger than the area of the red sub-pixel and the area of the green sub-pixel, respectively. In some examples, the area of the blue sub-pixel is larger than the area of the red sub-pixel; the area of the red sub-pixel is larger than the area of the green sub-pixel. In some examples, the area of the blue sub-pixel is larger than the area of the green sub-pixel; the area of the green sub-pixel is larger than the area of the red sub-pixel.

In one arrangement of the present disclosure, the center of the third sub-pixel of each second virtual rectangle is located at the intersection of the line connecting of the centers of the adjacent two first sub-pixels of the corresponding second virtual rectangle and the line connecting of the centers of the adjacent two second sub-pixels of the corresponding second virtual rectangle.

In one arrangement of the present disclosure, the area of each third sub-pixel is the same, and the shape of each third sub-pixel is consistent. The area of each first sub-pixel is the same, and the shape of each first sub-pixel is consistent. The area of each second sub-pixel is the same, and the shape of each second sub-pixel is consistent.

In one arrangement of the present disclosure, the area of each third sub-pixel is the same, and the shape of each third sub-pixel is consistent. The area of each first sub-pixel is the same, and the shape of each first sub-pixel is consistent. Or, the area of each second sub-pixel is the same, and the shape of each second sub-pixel is consistent.

According to another aspect of the present disclosure, an organic light emitting diode display panel is provided. In the arrangement, the organic light emitting diode display panel includes the plurality of above-mentioned pixel arrangement structures. The adjacent first virtual rectangles are configured to share the sub-pixels on respective facing side in the row direction and the column direction.

According to another aspect of the present disclosure, a display device is provided. The display device includes the above-mentioned organic light emitting diode display panel.

According to another aspect of the present disclosure, a mask plate assembly is provided. The mask plate assembly is used to manufacture the above-mentioned pixel arrangement structure. The mask plate assembly includes a first mask plate, having a plurality of first open regions, the first open region is configured to correspond with the shape and position of the first sub-pixel. The mask plate assembly includes a second mask plate having a plurality of second open regions. The second open region is configured to correspond with the shape and position of the second sub-pixel. The mask plate assembly includes a third mask plate having a plurality of third open regions. The third open region is configured to correspond with the shape and position of the third sub-pixel.

A pixel arrangement structure, an organic light emitting diode display panel, a mask plate assembly and a display device are provided in the arrangement of the present disclosure. In an arrangement, in the pixel arrangement structure, the first sub-pixels are located at the center position of the first virtual rectangle and the positions of four vertex angles of the first virtual rectangle; the second sub-pixel is located at the center position of the side of the first virtual rectangle; and the third sub-pixel is located in the second virtual rectangle. The second virtual rectangle is sequentially connected by two second sub-pixels and two first sub-pixels, the two second sub-pixels and the two first sub-pixels are as vertex angles, the two second sub-pixels are located at the center positions of the adjacent two sides of the first virtual rectangle, and the two first sub-pixels are adjacent to the two second sub-pixels and respectively located at the center position of the first virtual rectangle and at a vertex angle position of the first virtual rectangle. And four second virtual rectangles are constituted a first virtual rectangle. Compared with the pixel arrangement structure of the related art, such pixel arrangement manner can make the first sub-pixel, the second sub-pixel and the third sub-pixel closely arranged under the same process condition. Thereby under the condition that the minimum sub-pixel interval is satisfied, the area of the single sub-pixel is increased as much as possible, thereby reducing the drive current of the display means and increasing the lifetime of the display means.

DETAILED DESCRIPTION

In order to make the present disclosure more clear, the present disclosure will be further described in detail below in conjunction with the accompanying drawings. Obviously, the described arrangements are only a part of the arrangements of the present disclosure, and are not all the arrangements. Based on the arrangement of the present disclosure, all the other arrangements obtained by those skilled in the art without making inventive efforts are all within the protection scope of the present disclosure.

The shape and size of each component in the accompanying drawings do not reflect the true proportion. The purpose is merely to schematically illustrate the content of the present disclosure.

Figure 1:
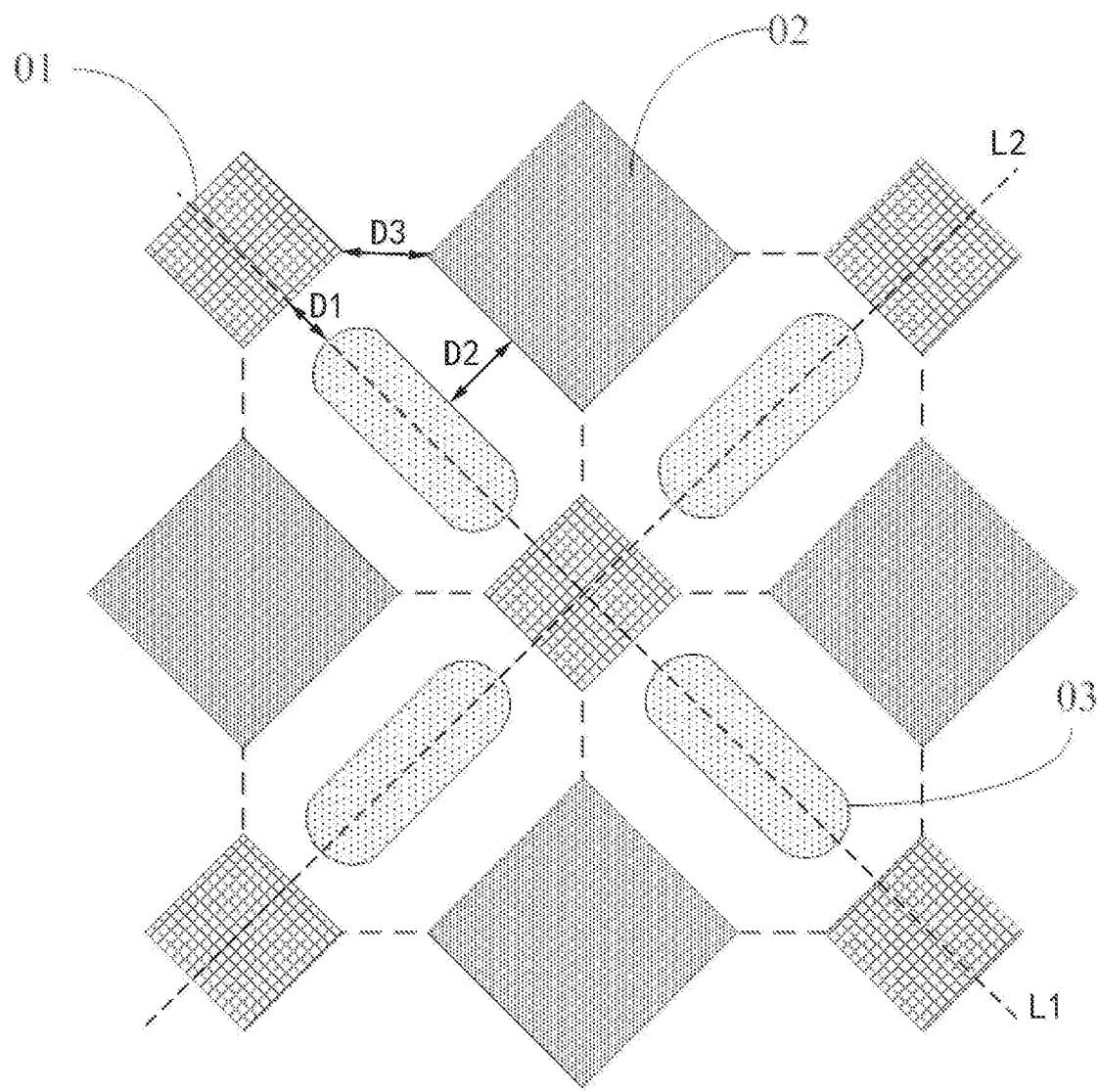
FIG. 1 is a first schematic view of the pixel arrangement structure provided in the arrangement of the present disclosure.

A pixel arrangement structure is provided in the arrangement of the present disclosure. As shown in FIG. 1, the pixel arrangement structure includes a plurality of first sub-pixels 01, a plurality of second sub-pixels 02, and a plurality of third sub-pixels 03. The positions of the above all sub-pixels are not overlapped with each other;

One of the plurality of first sub-pixels 01 is located at the center position of a first virtual rectangle, and four of the plurality of first sub-pixels 01 are located at four vertex angle positions of the first virtual rectangle respectively;

Four of the plurality of second sub-pixels 02 are located at the center positions of four sides of the first virtual rectangle respectively;

The first virtual rectangle is divided into four second virtual rectangles, and the inside of each of the four second virtual rectangles each includes one third sub-pixel 03 of the plurality of third sub-pixels 03.

It should be understood that the center position and the vertex angle position mentioned in the present disclosure are approximate positions, and not limited to the center point or the vertex. The existence of certain deviation is allowed, and only the area of the corresponding sub-pixels should cover the center point or the vertex.

Compared with the pixel arrangement structure of the related art, the pixel arrangement structure provided by the arrangement of the present disclosure can make the first sub-pixel 01, the second sub-pixel 02, and the third sub-pixel 03 be closely arranged under the same process conditions. Therefore, under the condition that the minimum sub-pixel interval is satisfied, the area of the single sub-pixel is increased as much as possible, thereby reducing the drive current of the display means and increasing the lifetime of the display means.

In the arrangement of the present disclosure, the second virtual rectangle is formed by sequentially connecting the four vertex angles, and the four vertex angles include two second sub-pixels 02 and two first sub-pixels 01. The two second sub-pixels 02 are located at center positions of two adjacent sides of the first virtual rectangle. Each of the two first sub-pixels 01 is adjacent to each of the two second sub-pixels 02, and one of the two first sub-pixels 01 is located at the center position of the first virtual rectangle and the other is located at a vertex angle position of the first virtual rectangle.

In the arrangement of the present disclosure, each of the third sub-pixels 03 is in a long strip shape, and the extension direction of the long strip shape is a direction which is away from the center of the first virtual rectangle.

In an arrangement, the extension direction of each third sub-pixel 03 inside of the four second virtual rectangles is different. In the present arrangement, the extension direction of each third sub-pixel 03 inside of the four second virtual rectangles is a direction which is away from the first sub-pixel 01 located at the center of the first virtual rectangle and extending in the corresponding second virtual rectangle.

The long strip shape is a mirror symmetrical view in the direction perpendicular to the extension direction thereof.

Arranging the third sub-pixel 03 in a long strip shape is beneficial to enlarge the area of the second sub-pixel 02, thereby the sub-pixel with low luminous efficiency in the display panel can be set as the second sub-pixel 02. In addition, the two ends of the long strip are symmetrically designed, which can reduce the pattern complexity of the evaporation mask plate, thereby simplifying the pattern composition process.

It should be noted that, in the pixel arrangement structure provided in the arrangement of the present disclosure, the mentioned sub-pixel locating at a certain position is referred to a position scope of the sub-pixel locating, and just make sure the sub-pixel overlap with the position. In particularly arrangement, the center of the sub-pixel may be overlapped with the position. Of course, the center of the sub-pixel may be not overlapped with the position. That is, a deviation is existed between the center of the sub-pixel and the position, which is not limited herein. Moreover, the center of the sub-pixel may be the geometric center of the sub-pixel pattern, and may also be the center of the emitting color of the sub-pixel, which is not limited herein.

In one arrangement of the present disclosure, in the pixel arrangement structure provided in the arrangement of the present disclosure, in order to ensure that each sub-pixel can be evenly distributed, the center of each sub-pixel is made as close as possible to the corresponding position.

In one arrangement of the present disclosure, in the pixel arrangement structure provided in the arrangement of the present disclosure, as shown in FIG. 1 to FIG. 7, the extension directions of the third sub-pixels 03 in the two second virtual rectangles which disposed along a diagonal of the first virtual rectangle are consistent.

In an arrangement, the first virtual rectangle is provided with a first diagonal line L1 and a second diagonal line L2. The third sub-pixels 03 in the two second virtual rectangles which disposed along the first diagonal line L1 are extended in the direction along the first diagonal line L1. The third sub-pixels 03 in the two second virtual rectangles which disposed along the second diagonal line L2 are extended in the direction along the second diagonal line L2.

In an arrangement, the third sub-pixels 03 in the two second virtual rectangles which disposed along the first diagonal line L1 are mirror symmetry with respect to the second diagonal line L2. The third sub-pixels 03 in the two second virtual rectangles which disposed along the second diagonal line L2 are mirror symmetry with respect to the first diagonal line L1.

The third sub-pixels 03 in the four second virtual rectangles constituting the first virtual rectangle are distributed in an "X" shape. That is, both ends of each third the third sub-pixel 03 are respectively pointed to the first sub-pixels 01 located at the two vertex angle positions of the second virtual rectangle in which the third sub-pixels 03 located.

It should be noted that, the first virtual rectangle mentioned in the display arrangement structure provided by the arrangement of the present disclosure is the largest dotted frame in FIG. 1, and the second virtual rectangle is a small dotted frame in FIG. 1. In FIG. 1, the first virtual rectangle includes four second virtual rectangles. The first virtual rectangle and the second virtual rectangle may be rectangular, may also be square, which is not limited herein.

In one arrangement of the present disclosure, in the pixel arrangement structure provided in the arrangement of the present disclosure, the first sub-pixel is a red sub-pixel, and the second sub-pixel is a blue sub-pixel. Or, the first sub-pixel is a blue sub-pixel, and the second sub-pixel is a red sub-pixel. The third sub-pixel is a green sub-pixel. Thus as shown in FIG. 2, the green sub-pixel G located at the inside of the second virtual rectangle may constitute a luminous pixel point with the red sub-pixel R and the blue sub-pixel B located at any two adjacent vertex angles of the second virtual rectangle.

Figure 2:
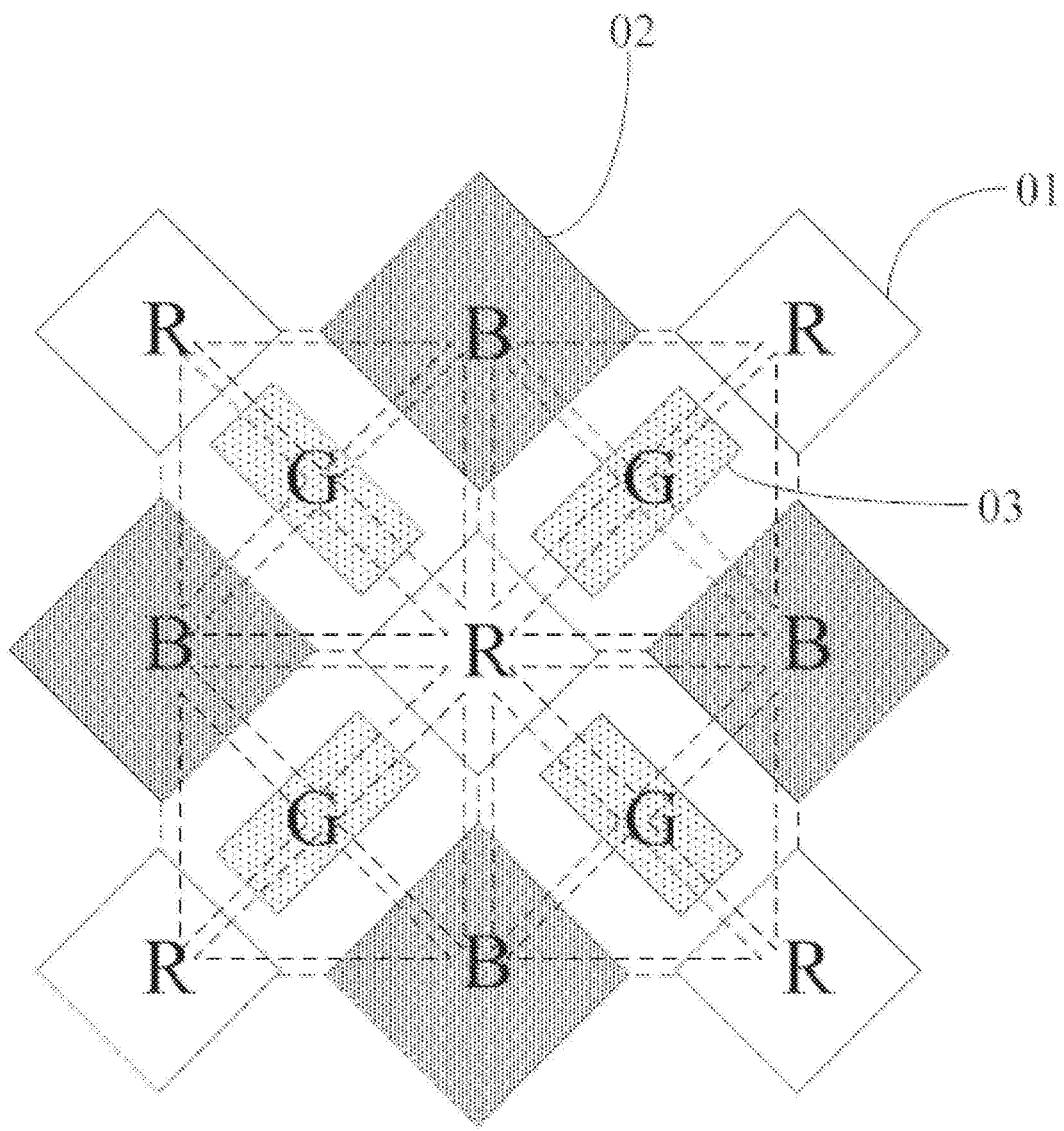
FIG. 2 is a second schematic view of the pixel arrangement structure provided in the arrangement of the present disclosure.

Further, since the luminous efficiency of the blue sub-pixel is lower, and the lifetime of the blue sub-pixel is shorter, in some arrangements of the present disclosure, in the pixel arrangement structure shown in FIG. 2, the first sub-pixel 01 is a red sub-pixel R, the second sub-pixel 02 is a blue sub-pixel B, and the third sub-pixel 03 is a green sub-pixel G. Thus the green sub-pixel G with strip shape can expand the area of the blue sub-pixel B toward the direction of the green sub-pixel G. Thereby, the area of the blue sub-pixel B is larger than the area of the red sub-pixel R and the area of the green sub-pixel G, respectively.

In an arrangement, the area of the blue sub-pixel B is larger than the area of the red sub-pixel R, and the area of the red sub-pixel R is larger than the area of the green sub-pixel G. In another arrangement, the area of the blue sub-pixel B is larger than the area of the green sub-pixel G, and the area of the green sub-pixel G is larger than the area of the red sub-pixel R.

Further, in the pixel arrangement structure provided in the arrangement of the present disclosure, since the luminous efficiency of the green sub-pixel is generally higher, the area of the green sub-pixel may be set to be smaller than the area of the red sub-pixel. Of course, in the specific implementation, the area of the green sub-pixel may also be the same as the area of the red sub-pixel, which is not limited herein.

It should be noted that the above-mentioned "area of the sub-pixel" and size thereof are aimed at sub-pixels area included in a first virtual rectangle. Since the sub-pixels on the sides and vertex angle of the first virtual rectangle are all shared with the adjacent first virtual rectangle, the area ratio of the pixels in one first virtual rectangle is different from the area ratio of the pixels in the overall panel.

For the overall panel, the total area ratio of the RGB sub-pixels may be, for example, 1:(1.1~1.5):(1.2~1.7). Further, the total area ratio of the RGB sub-pixels may be 1:(1.2~1.35):(1.4~1.55). Further, the total area ratio of the RGB sub-pixels may be 1:1.27:1.46. The total number ratio of RGB sub-pixels is 1:2:1.

In one arrangement of the present disclosure, in the above-mentioned pixel arrangement structure provided in the arrangement of the present disclosure, there is a first ratio between the minimum distance D1 which is between the opposite sides of the third sub-pixel 03 and the adjacent first sub-pixel 01, and the minimum distance D2 which is between the opposite sides of the third sub-pixel 03 and the adjacent second sub-pixel 02. There is a second ratio between the minimum distance D1 which is between the opposite sides of the third sub-pixel 03 and the adjacent first sub-pixel 01 and the minimum distance D3 which is between the opposite sides of the first sub-pixel 01 and the adjacent second sub-pixel 02. And there is a third ratio between the minimum distance D2 which is between the opposite sides of the third sub-pixel 03 and the adjacent second sub-pixel 02, and the minimum distance D3 which is between the opposite sides of the first sub-pixel 01 and the adjacent second sub-pixel 02. The first ratio, the second ratio, and the third ratio are all in the range of 0.8-1.2, such as 0.9, 1, 1.1.

In one arrangement of the present disclosure, two or three among the first ratio, the second ratio and the third ratio are equal.

In one arrangement of the present disclosure, the each first sub-pixel, the each second sub-pixel, and the each third sub-pixel are arranged substantially equidistantly with respect to each other.

As shown in FIG. 1, the minimum distance refers to the shortest distance between the opposite sides. The opposite sides may be straight lines or curved lines, and the opposite sides are parallelizable.

In other words, the minimum distance needs to be greater than or equal to the process limit distance, and the minimum distance between the opposite sides of the third sub-pixel 03 and the adjacent second sub-pixel 02 needs to be greater than or equal to the process limit distance to satisfy the process requirements.

In one arrangement of the present disclosure, in the above-mentioned pixel arrangement structure provided by the arrangement of the present disclosure, the ratio of a maximum distance between the opposite sides of the third sub-pixel 03 and the adjacent first sub-pixel 01 to a minimum distance between the opposite sides of the third sub-pixel and the adjacent first sub-pixel is in a range of 1~1.5, for example, 1.1, 1.2, 1.3, 1.4, etc.

In one arrangement of the present disclosure, in the above-mentioned pixel arrangement structure provided by the arrangement of the present disclosure, the ratio of a maximum distance between the opposite sides of the third sub-pixel 03 and the adjacent second sub-pixel 02 to a minimum distance between the opposite sides of the third sub-pixel and the adjacent second sub-pixel is in a range of 1~1.5, for example, 1.1, 1.2, 1.3, 1.4, etc.

In one arrangement of the present disclosure, in the pixel arrangement structure provided in the arrangement of the present disclosure, in order to enable the third sub-pixel 03 to be evenly distributed in the pixel arrangement structure to reduce the spacing between the third sub-pixel 03 and the adjacent first sub-pixel 01, and to reduce the spacing between the third sub-pixel 03 and the adjacent second sub-pixel 02, as shown in FIG. 2 to FIG. 7, the center of the third sub-pixel 03 of each second virtual rectangle is located at the intersection of the line connecting of the centers of the adjacent two first sub-pixels 01 and the line connecting of the centers of the adjacent two second sub-pixels 02 of the corresponding second virtual rectangle, that is, located at the center of the second virtual rectangle.

In one arrangement of the present disclosure, in the pixel arrangement structure provided in the arrangement of the present disclosure, in order to ensure that the gap width between the third sub-pixel 03 and the adjacent first sub-pixel 01 is consistent to reduce the spacing between the third sub-pixel 03 and the adjacent first sub-pixel 01, as shown in FIG. 1 to FIG. 7, the opposite sides of the third sub-pixel 03 and the adjacent first sub-pixels 01 are parallel to each other. Of course, in the specific implementation, the opposite sides of the third sub-pixel 03 and the adjacent first sub-pixel 01 may also be not parallel, which is not limited herein.

It should be noted that, in the pixel arrangement structure provided in the arrangement of the present disclosure, the shape of the sub-pixel is referred to a shape with the existence of certain process fluctuations and errors. For a high-resolution display panel, since the sub-pixel itself has a smaller area, a method commonly used in the art can be adopted for the correction or compensation of the mask plate pattern to obtain a precise sub-pixel pattern.

Figure 6:
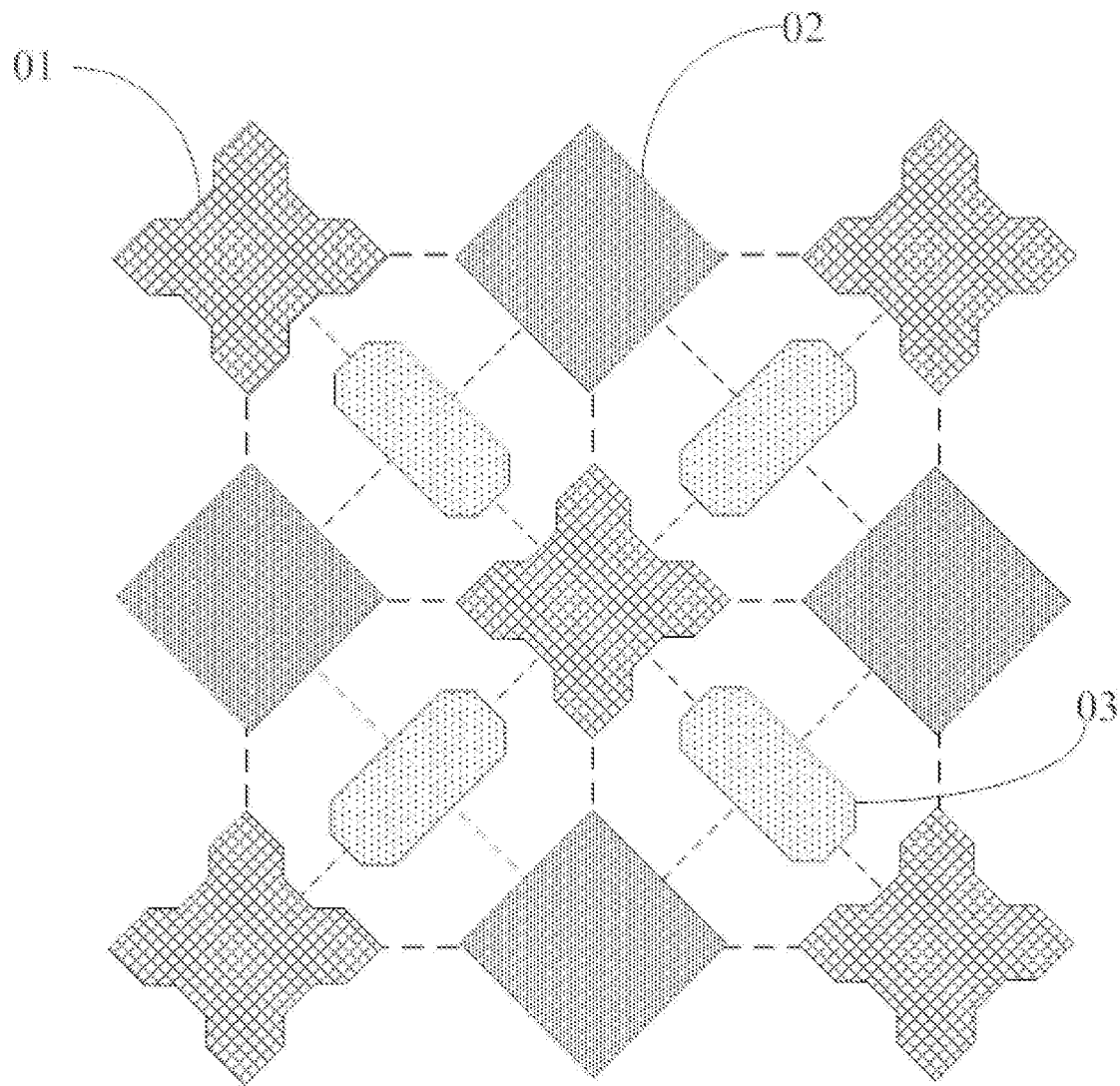
FIG. 6 is a sixth schematic view of the pixel arrangement structure provided in the arrangement of the present disclosure.
Figure 7:
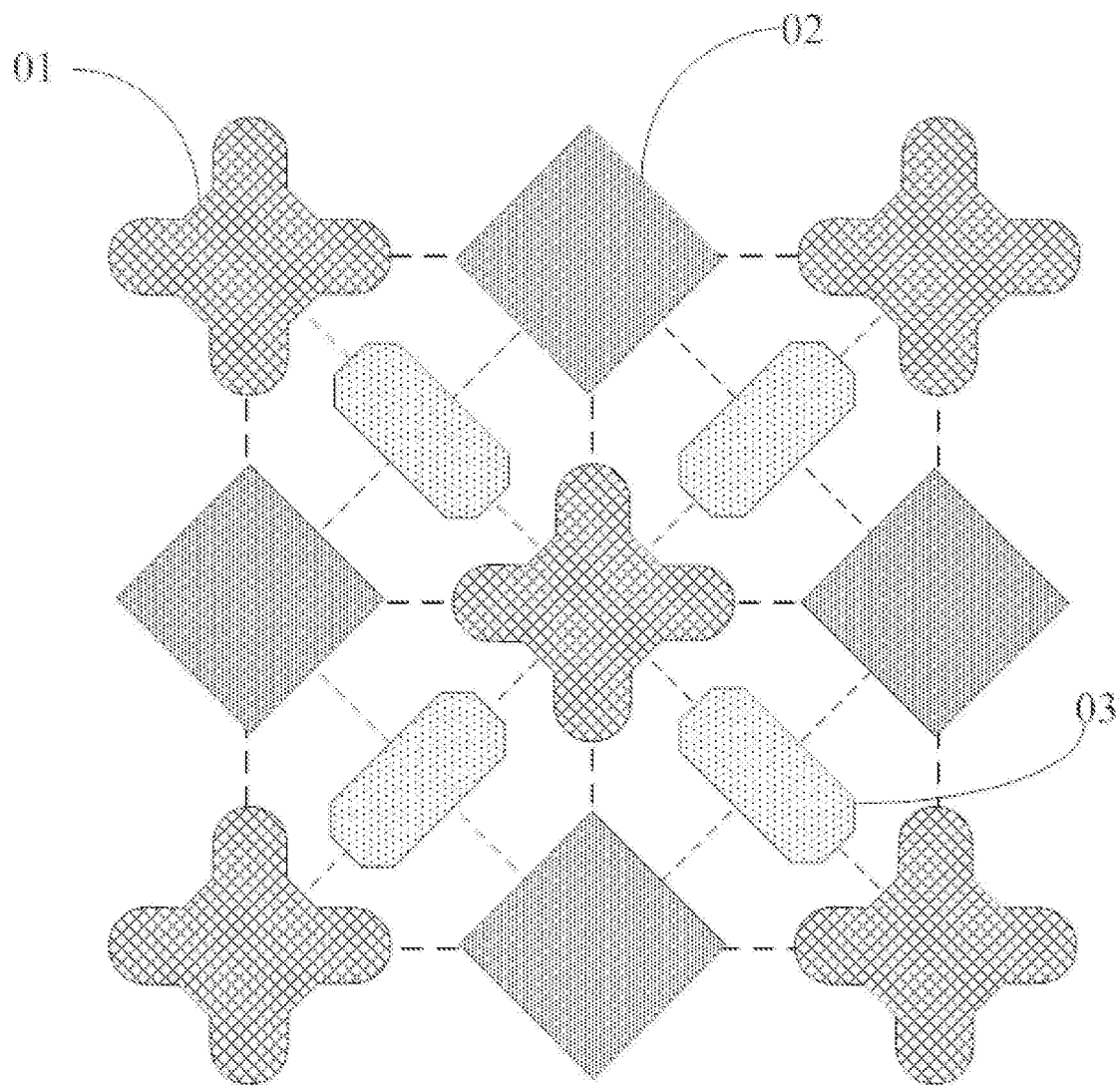
FIG. 7 is a seventh schematic view of the pixel arrangement structure provided in the arrangement of the present disclosure.
Figure 8:
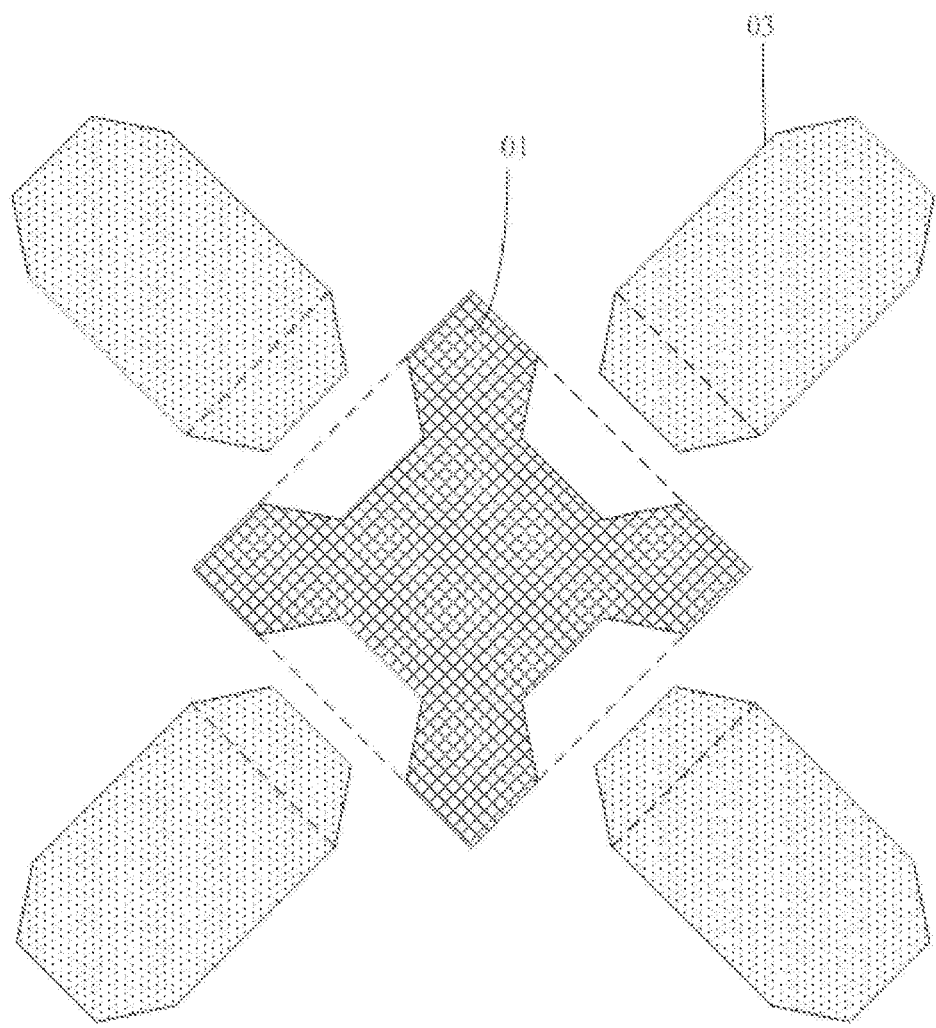
FIG. 8 is a schematic view of the shape matching of a second sub-pixel and a third sub-pixel in a pixel arrangement structure provided in the arrangement of the present disclosure.

In the specific implementation, the inner angle of the sub-pixel shape is larger, or closer to the circular arc, the easier it is to realize during evaporating. Therefore, in one arrangement of the present disclosure, in the pixel arrangement structure provided in the arrangement of the present disclosure, as shown in FIG. 1, FIG. 3 to FIG. 5, the two ends of the long strip shape are circular arc shape that protrudes outward from the interior of the long strip shape; Or as shown in FIG. 6 to FIG. 8, both ends of the long strip are polygons, for example, isosceles trapezoid of FIG. 6 to FIG. 8. Of course, in the specific implementation, the shape of the long strip may also be rectangle as shown in FIG. 2, which is not limited herein.

Figure 3:
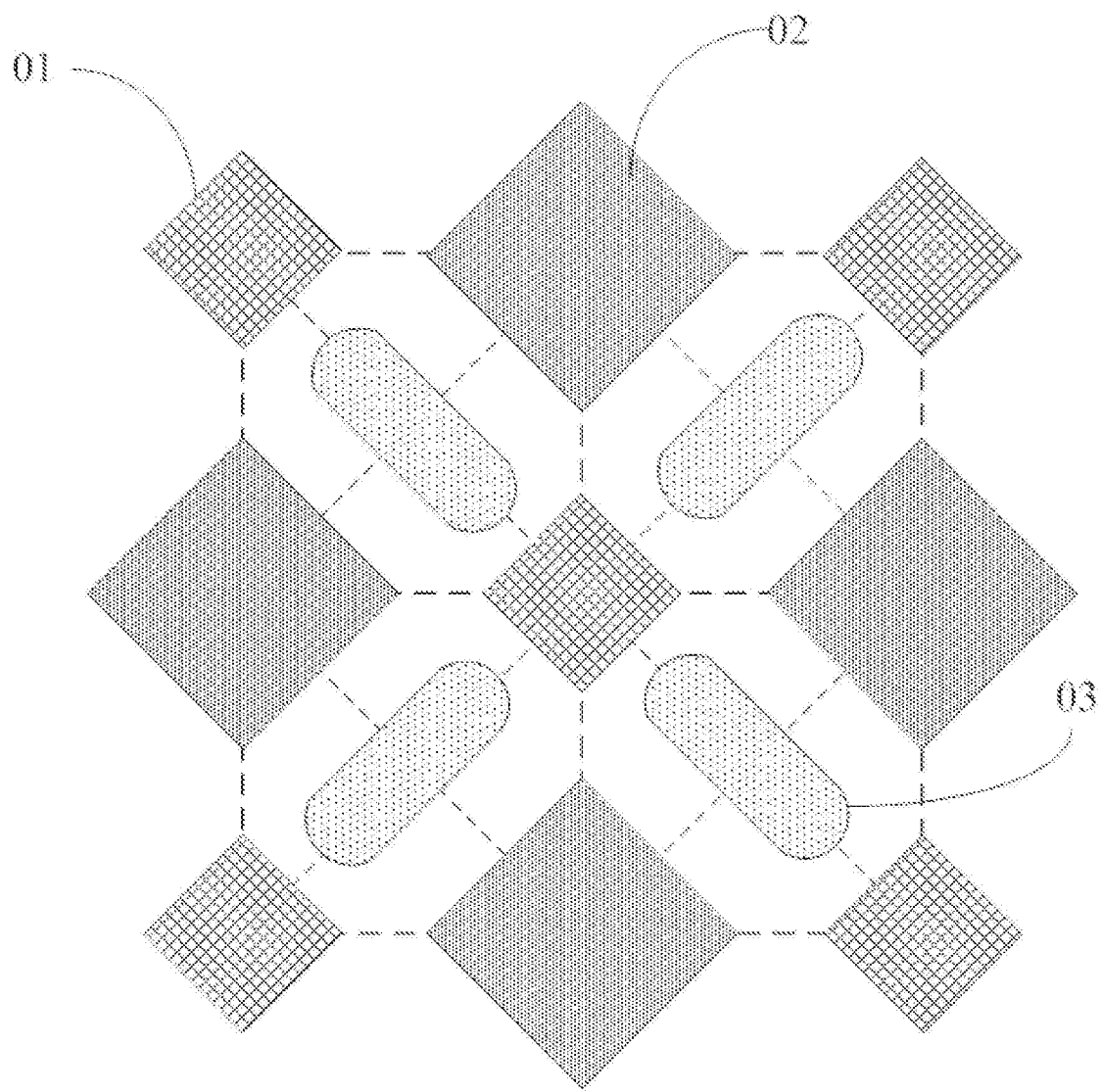
FIG. 3 is a third schematic view of the pixel arrangement structure provided in the arrangement of the present disclosure.
Figure 4:
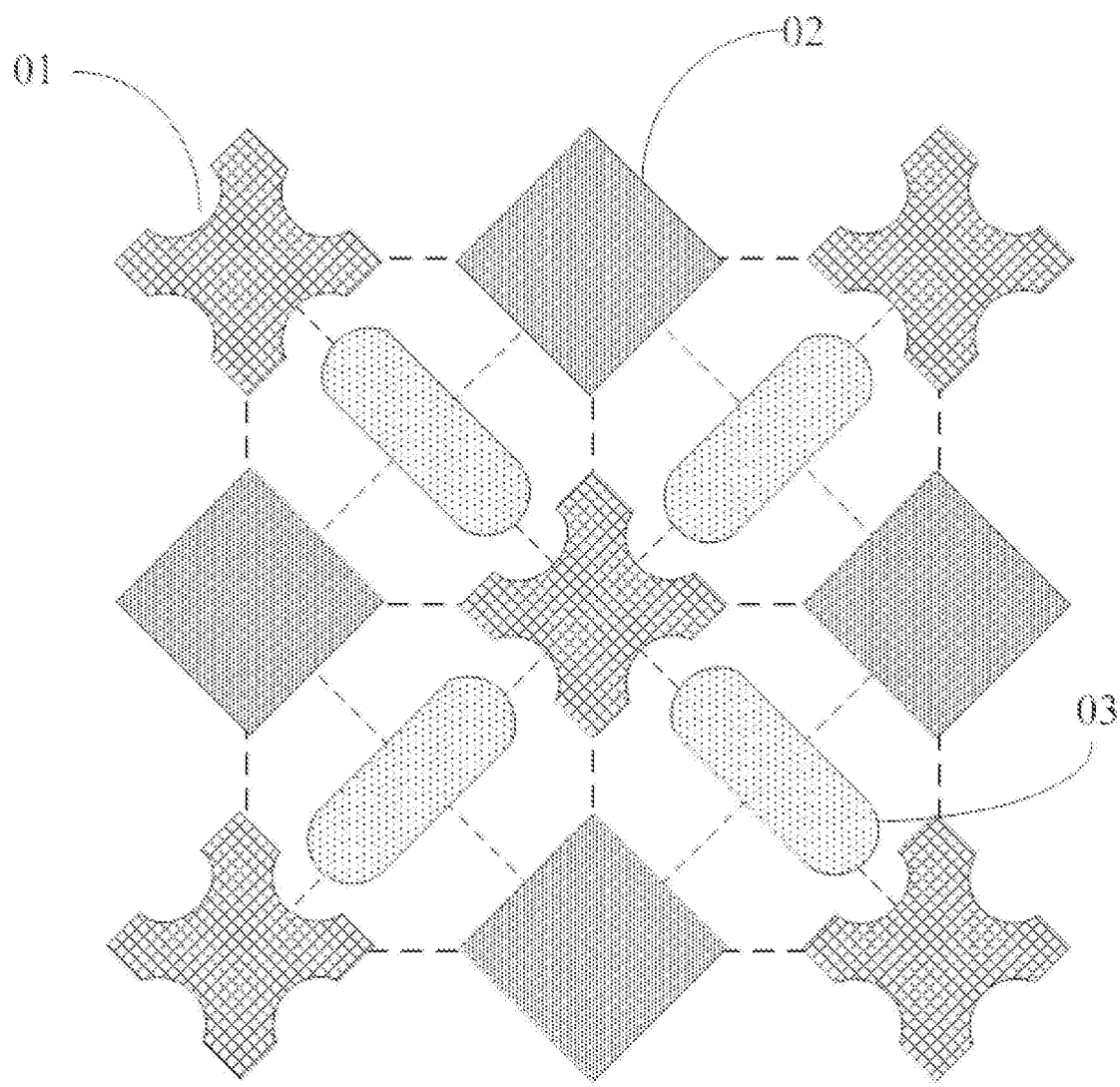
FIG. 4 is a fourth schematic view of the pixel arrangement structure provided in the arrangement of the present disclosure.

In one arrangement of the present disclosure, in the pixel arrangement structure provided in the arrangement of the present disclosure, as shown in FIG. 1 to FIG. 3, the shape of the first sub-pixel 01 is a substantial rectangle. Of course, other regular patterns or irregular patterns may also be used, which is not limited herein.

In one arrangement of the present disclosure, in the pixel arrangement structure provided in the arrangement of the present disclosure, as shown in FIG. 4 to FIG. 8, the shape of the first sub-pixel 01 is a substantial cruciform. Thus the first sub-pixel 01 and the third sub-pixel can be closely arranged, and color mixing can be avoided on the basis of ensuring the sub-pixel area.

Specifically, in the pixel arrangement structure provided in the arrangement of the present disclosure, as shown in FIG. 8, the cruciform is a shape formed by the concave of the middle of the four sides of the quadrilateral, and the four vertex angles of the quadrilateral are as four ends of the cruciform respectively, among them, the quadrilateral is a substantial diamond shape or a substantial square. The specific concave depth and shape are matched with the two ends of the long strip of the third sub-pixel 03 with long strip shape.

In one arrangement of the present disclosure, in the pixel arrangement structure provided in the arrangement of the present disclosure, as shown in FIG. 4 to FIG. 7, each inner angle of the first sub-pixel 01 is greater than or equal to 90 degrees. The larger each inner angle of the first sub-pixel 01, the easier to realize evaporating. On the contrary, if the inner angle of the sub-pixel is smaller, it needs to make compensation for the mask plate pattern for preparing a sub-pixel shape with a smaller inner angle. Therefore, the pattern complexity of the mask plate can be reduced by making the inner angle of the first sub-pixel 01 greater than or equal to 90 degrees.

Figure 5:
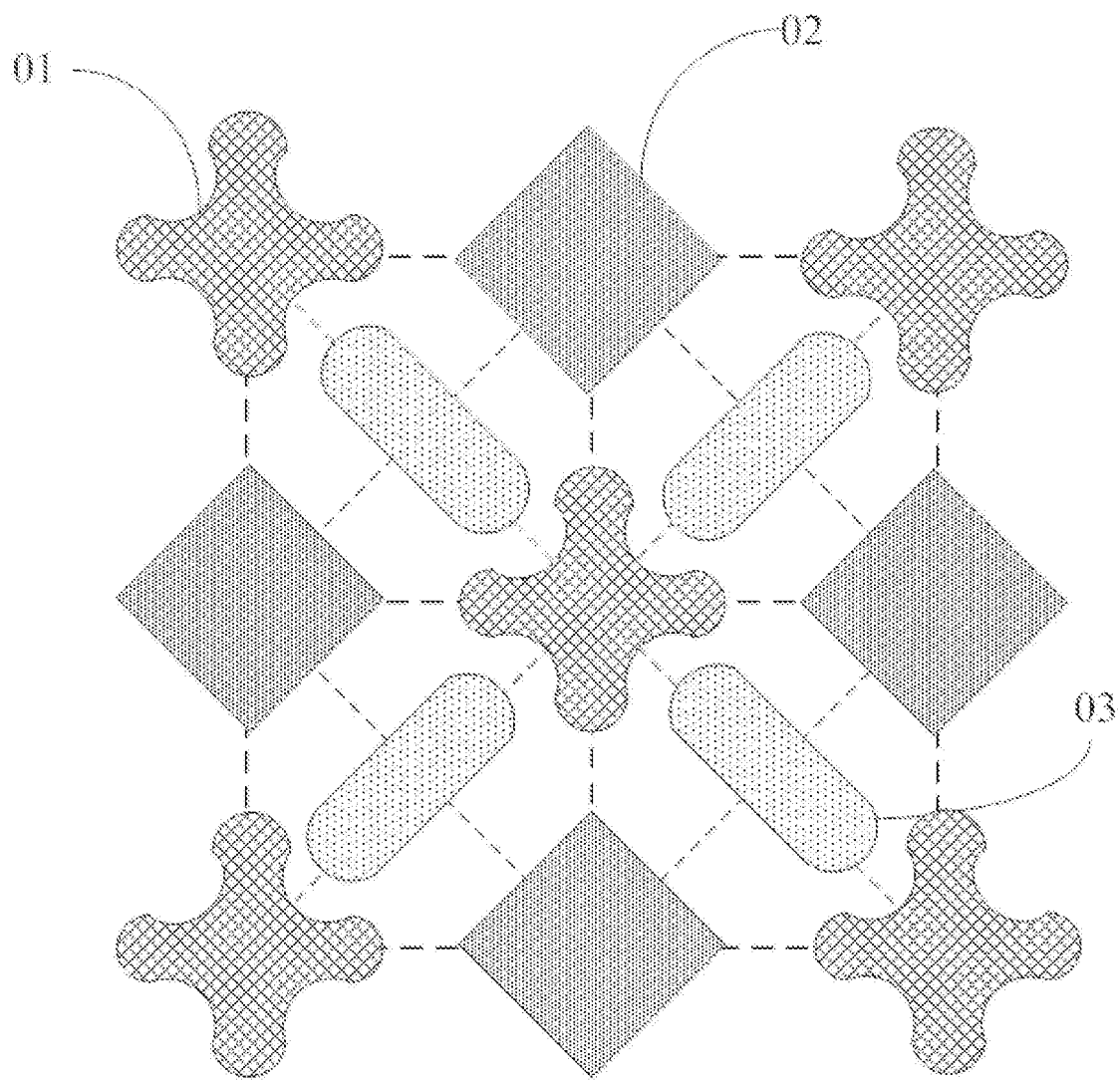
FIG. 5 is a fifth schematic view of the pixel arrangement structure provided in the arrangement of the present disclosure.

In one arrangement of the present disclosure, in the pixel arrangement structure provided in the arrangement of the present disclosure, as shown in FIG. 5 and FIG. 7, the four vertex angles of the substantial rhombus or the substantial square are rounded corners. That is, the four ends of the cruciform are all rounded corners or all circular arc shape.

In one arrangement of the present disclosure, in the pixel arrangement structure provided in the arrangement of the present disclosure, in order to ensure that the gap width between the third sub-pixel 03 and the adjacent second sub-pixel 02 is consistent to reduce the spacing between the third sub-pixel 03 and the adjacent second sub-pixel 02. As shown in FIG. 1 to FIG. 7, the opposite sides of the third sub-pixel 03 and the adjacent second sub-pixel 02 are parallel to each other.

Specifically, in the pixel arrangement structure provided in the arrangement of the present disclosure, since the third sub-pixel 03 is in a long strip shape, and the opposite sides of the third sub-pixel 03 and the adjacent second sub-pixel 02 are parallel to each other, setting the opposite sides of the third sub-pixel 03 and the adjacent second sub-pixel 02 to be straight line shape can simplify the pattern complexity of the mask plate as much as possible. Therefore, in one arrangement of the present disclosure, in the pixel arrangement structure provided in the arrangement of the present disclosure, as shown in FIG. 1 to FIG. 7, the shape of the second sub-pixel 02 is a substantial rectangle.

In one implementation, the opposite sides of the third sub-pixel 03 and the adjacent second sub-pixel 02 may also be not parallel, which is not limited herein.

In one arrangement of the present disclosure, in the pixel arrangement structure provided in the arrangement of the present disclosure, the minimum spacing between the third sub-pixel 03 and the first sub-pixel 01 is equal to the minimum spacing between the third sub-pixel 03 and the second sub-pixel 02.

Moreover, the minimum spacing is generally the process limit distance, and the numerical range of the minimum spacing is generally related to the used manufacturing process. When a fine metal mask plate (FMM) matched with the etching process is adopted to form the sub-pixel shape, the minimum spacing is about 16 µm, and the minimum spacing will be smaller when a laser or electroforming process is adopted to form the sub-pixel shape.

In one arrangement of the present disclosure, in the pixel arrangement structure provided in the arrangement of the present disclosure, the minimum spacing between the any adjacent two first sub-pixel 01 and the second sub-pixel 02 is equal.

In one arrangement of the present disclosure, in the pixel arrangement structure provided in the arrangement of the present disclosure, as shown in FIG. 1 to FIG. 7, the area of each third sub-pixel 03 is the same, thereby ensuring that in any luminous pixel point composed by the first sub-pixel 01, the second sub-pixel 02 and the third sub-pixel 03, the luminous area of the third sub-pixel 03 is all the same.

Of course, in the specific implementation, in the pixel arrangement structure provided in the arrangement of the present disclosure, the areas of at least two third sub-pixels 03 may also be not same, which is not limited herein.

During the manufacturing process, in order to ensure that the mask pattern can be consistent for the same kind of sub-pixel, thereby capable of simplifying the pattern composition process, in one arrangement of the present disclosure, in the pixel arrangement structure shown in FIG. 1 to FIG. 7, the shape of each third sub-pixel 03 is consistent.

Of course, in the specific implementation, in the pixel arrangement provided by the arrangement of the present disclosure, the shapes of at least two third sub-pixels may also be not consistent, which is not limited herein.

In one arrangement of the present disclosure, in the pixel arrangement structure provided in the arrangement of the present disclosure, as shown in FIG. 1 to FIG. 7, the area of each second sub-pixel 02 is the same, thereby ensuring that in any luminous pixel point composed by the first sub-pixel 01, the second sub-pixel 02 and the third sub-pixel 03, the luminous area of the second sub-pixel 02 is all the same.

Of course, in the specific implementation, in the pixel arrangement structure provided in the arrangement of the present disclosure, the areas of at least two second sub-pixels 02 may also be not the same, which is not limited herein.

During the manufacturing process, in order to ensure that the mask pattern can be consistent for the same kind of sub-pixel, thereby capable of simplifying the pattern composition process, in one arrangement of the present disclosure, in the pixel arrangement structure provided in the arrangement of the present disclosure, as shown in FIG. 1 to FIG. 7, the shape of each second sub-pixel 02 is consistent.

Of course, in the specific implementation, in the pixel arrangement structure provided in the arrangement of the present disclosure, the shape of at least two second sub-pixels 02 may also be not consistent, which is not limited herein.

Moreover, in one arrangement of the present disclosure, in the above-mentioned pixel arrangement provided by the arrangement of the present disclosure, when the shapes of the four second sub-pixels 02 in a first virtual rectangle are the same or similar, the arrangement angles thereof may be the same, and the arrangement angles thereof may also be rotated arbitrarily, which is not limited herein.

In one arrangement of the present disclosure, in the pixel arrangement structure provided in the arrangement of the present disclosure, as shown in FIG. 1 to FIG. 7, the area of each first sub-pixel 01 is the same, thereby ensuring that in any luminous pixel point composed by the first sub-pixel 01, the second sub-pixel 02 and the third sub-pixel 03, the luminous area of the first sub-pixel 01 is all the same.

In the specific implementation, in the pixel arrangement structure provided in the arrangement of the present disclosure, the areas of at least two first sub-pixels 01 may also not be the same, which is not limited herein.

During the manufacturing process, in order to ensure that the mask pattern can be consistent for the same kind of sub-pixel, thereby capable of simplifying the pattern composition process, in one arrangement of the present disclosure, in the pixel arrangement structure provided in the arrangement of the present disclosure, as shown in FIG. 1 to FIG. 7, the shape of each first sub-pixel 01 is consistent.

In the specific implementation, in the pixel arrangement structure provided in the arrangement of the present disclosure, the shapes of at least two first sub-pixels may also be not consistent, which is not limited herein.

Moreover, in one arrangement of the present disclosure, in the above-mentioned pixel arrangement structure provided by the arrangement of the present disclosure, when the shapes of the five first sub-pixels 01 in a first virtual rectangle are the same or similar, the arrangement angles thereof may be the same, and the arrangement angles thereof may also be rotated arbitrarily, which is not limited herein.

In one arrangement of the present disclosure, the specific shapes, position relationships, parallel and angle relationships of the second sub-pixel 02, the first sub-pixel 01 and the third sub-pixel 03 can be designed as needed. In the actual process, due to the limitation of the process conditions or other factors, there may also be some deviation. Therefore, the shape, position and relative position relationship of each sub-pixel only needs to substantially satisfy the above-mentioned conditions, which all belong to the pixel arrangement structure provided by the arrangement of the present disclosure.

It should be noted that, the pattern inconformity of the sub-pixels mentioned in the arrangement of the present disclosure are referred to the shapes inconformity of the sub-pixels, for example, one is a circle and one is a rectangle. On the contrary, the pattern conformity of the sub-pixels mentioned in the arrangement of the present disclosure are referred to the shape similarity or identity of the sub-pixels. For example, the shapes of the two sub-pixels are both triangles, regardless of whether the areas are equal or not, then the shapes of the two sub-pixels is considered to be consistent.

Figure 9:
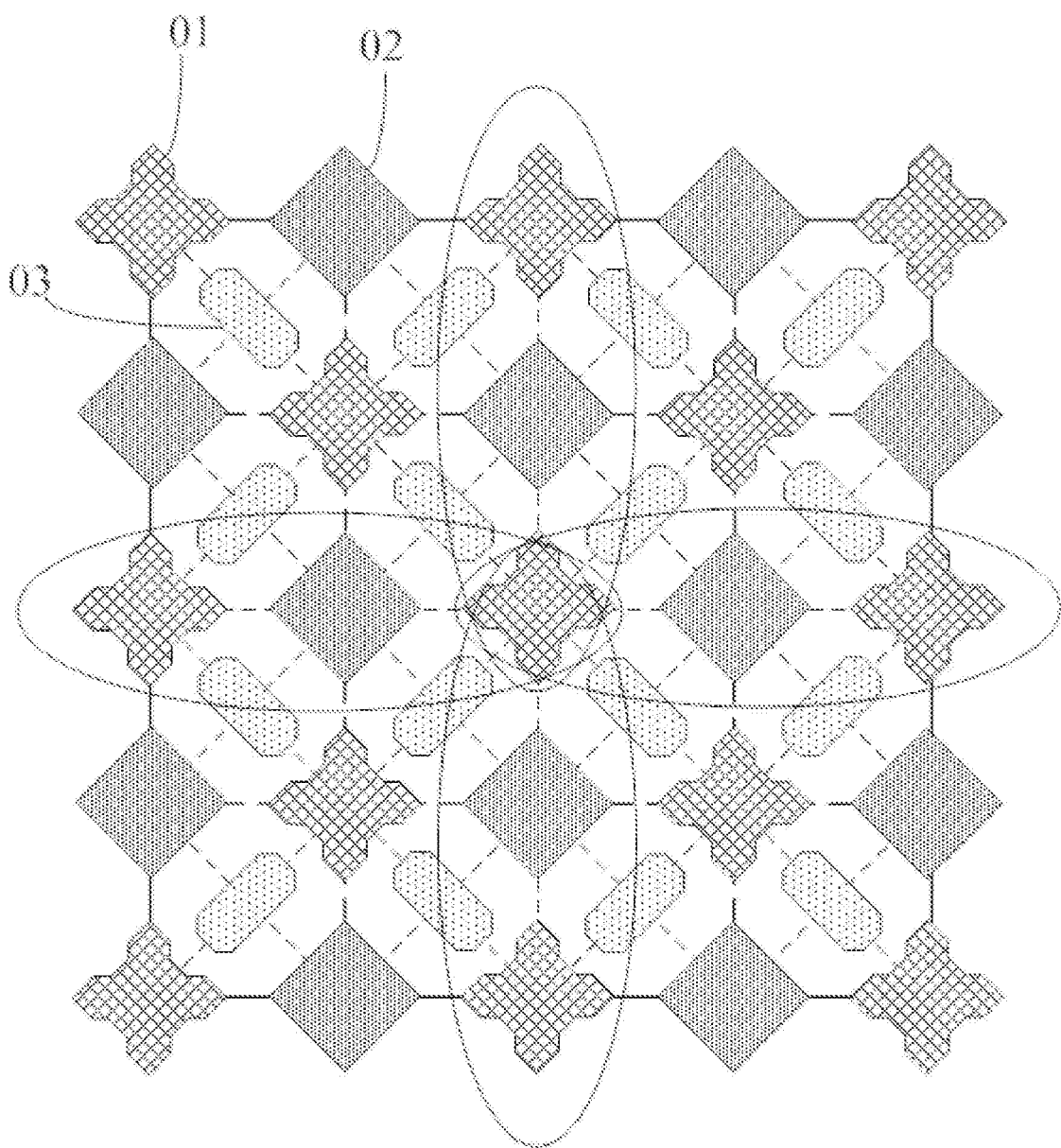
FIG. 9 is a structure schematic view of an organic light emitting diode display panel provided in the arrangement of the present disclosure.

Based on the same disclosed conception, an organic light emitting diode display panel is further provided in the arrangement of the present disclosure, as shown in FIG. 9, the display panel includes a plurality of closely arranged pixel arrangement structures (taking four pixel arrangement structures as an example in FIG. 9). The pixel arrangement structure may be any one kind of the above-mentioned pixel arrangement structures provided by the arrangement of the present disclosure. The adjacent first virtual rectangles are configured to share the sub-pixel on respective facing sides in the row direction and the column direction. That is, the first sub-pixel 01 and the second sub-pixel 02 located on the sides of the adjacent first virtual rectangles are shared by the adjacent two pixel arrangement structures. For example, three sub-pixels circled by each ellipse in FIG. 9 are sub-pixels shared by two adjacent pixel arrangement structures. Since the principle of solving the problem by the organic light emitting diode display panel is similar to the foregoing pixel arrangement structure, the implementation of the organic light emitting diode display panel can be referred to the implementation of the foregoing pixel arrangement structure, and there is no more repeated detailed description.

Specifically, the organic light emitting diode display panel is provided in the arrangement of the present disclosure, as shown in FIG. 9, the first sub-pixel 01 and the second sub-pixel 02 are alternately arranged in the row direction, and the first sub-pixel 01 and the second sub-pixel 02 are alternately arranged in the column direction, and the third sub-pixel 03 is located in the second virtual rectangle surrounded by two first sub-pixels 01 and two second sub-pixels 02. Thus, when displaying, any adjacent two first sub-pixel 01 and second sub-pixel 02 can constitute a luminescent pixel point with a third sub-pixel 03 adjacent thereto. Among the sub-pixels, a high-resolution display effect is achieved from a physical resolution with low-resolution by the lend color principle.

Based on the same disclosed conception, a display device is further provided in the arrangement of the present disclosure, the display device includes any one kind above-mentioned organic light emitting diode display panel provided in the arrangement of the present disclosure. The display device can be any product or component with a display function, such as a mobile phone, a tablet computer, a television, a displayer, a notebook computer, a digital photo frame, a navigator, etc. The implementation of the display device can be referred to the arrangement of the foregoing display panel, and there is no more repeated detailed description.

Figure 10:
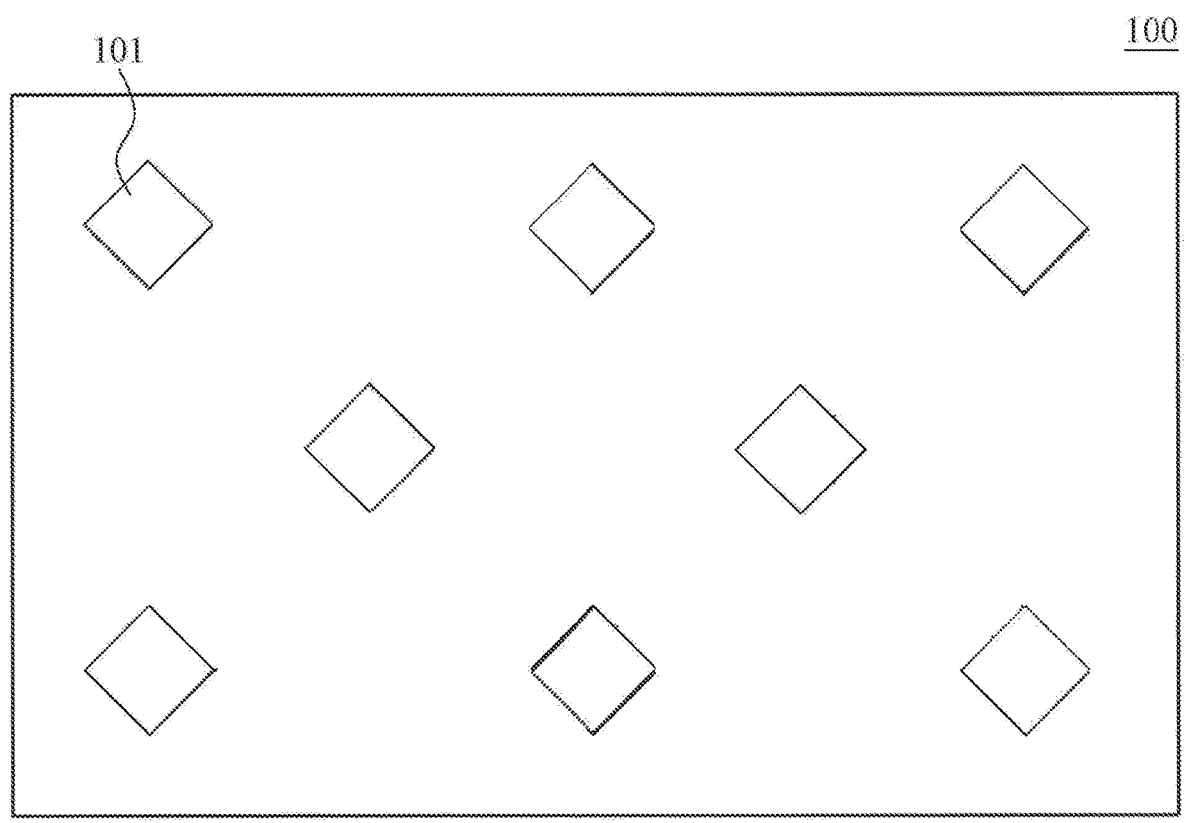
FIG. 10 is a structure schematic view the first mask plate of the mask plate assembly provided in the arrangement of the present disclosure.
Figure 11:
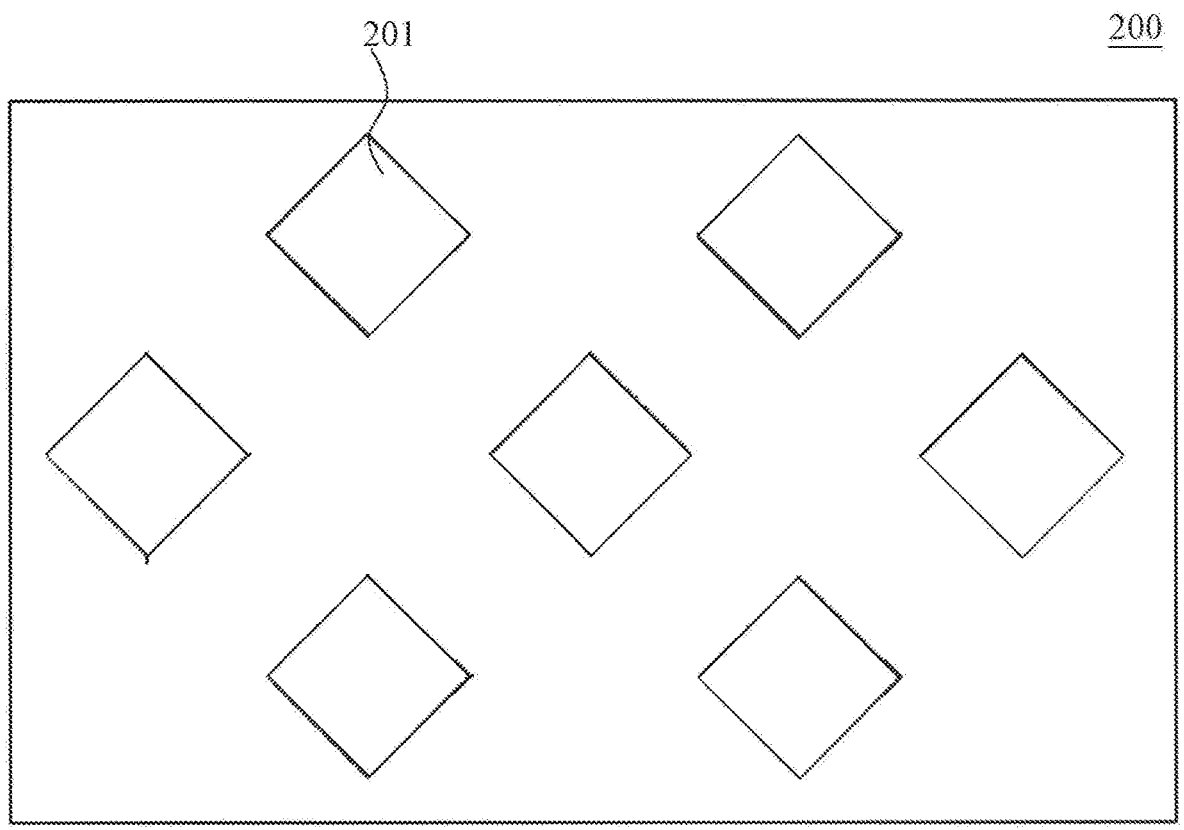
FIG. 11 is a structure schematic view the second mask plate of the mask plate assembly provided in the arrangement of the present disclosure.
Figure 12:
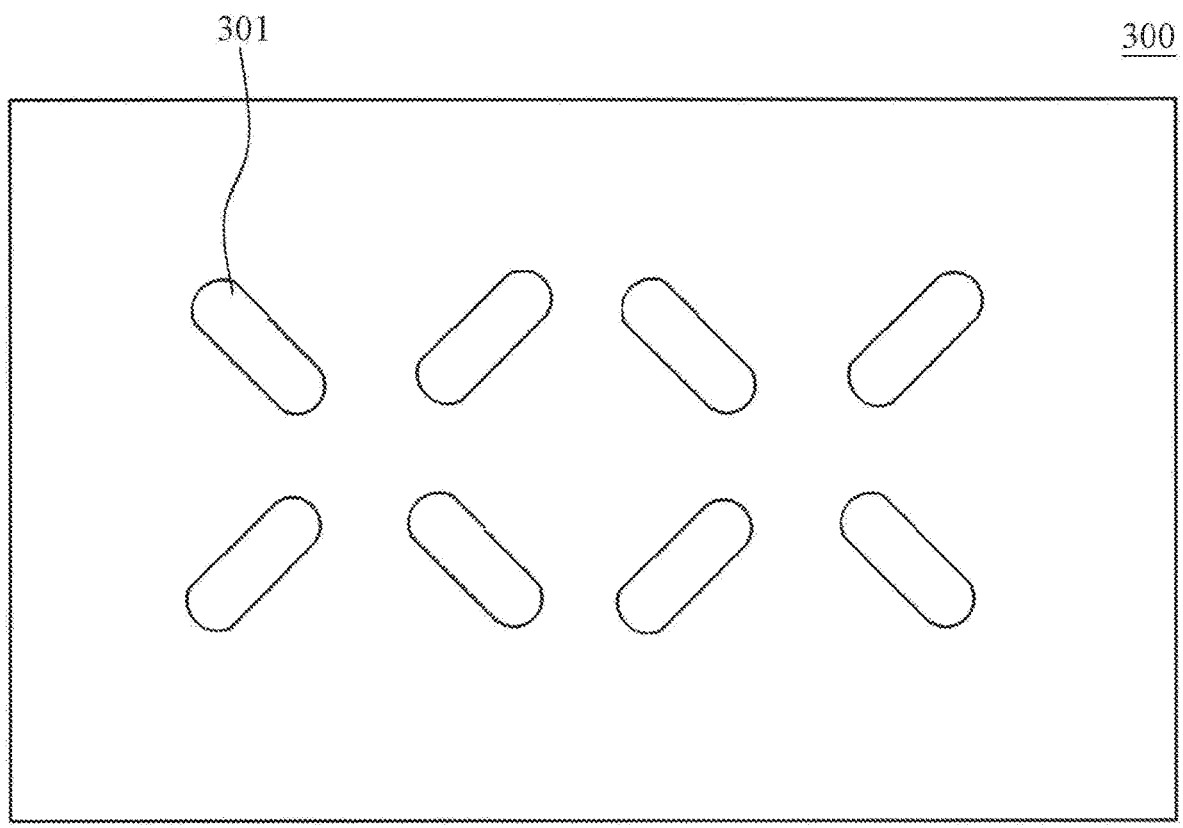
FIG. 12 is a structure schematic view the third mask plate of the mask plate assembly provided in the arrangement of the present disclosure.

Based on the same disclosed conception, a mask plate assembly is further provided by the arrangement of the present disclosure, such as a high precision metal mask plate, which is used for manufacturing the above-mentioned any one kind pixel arrangement structure provided by the arrangement of the present disclosure. As shown in FIG. 10 to FIG. 12, the mask plate assembly includes a first mask plate 100, a second mask plate 200 and a third mask plate 300. The first mask plate 100 has a plurality of first open regions 101, as shown in FIG. 10, and the first open regions 101 are corresponding to the shape and position of the first sub-pixel 01. The second mask plate 200 has a plurality of second open regions 201, as shown in FIG. 11, and the second open regions 201 are corresponding to the shape and position of the second sub-pixel 02. The third mask plate 300 has a plurality of third open regions 301, as shown in FIG. 12, and the third open regions 301 are corresponding to the shape and position of the third sub-pixel 03. Since the principle of solving the problem by the mask plate is similar to the foregoing pixel arrangement structure, thus the implementation of the mask plate can be referred to the implementation of the foregoing pixel arrangement structure, and there is no more repeated detailed description.

The above-mentioned pixel arrangement structure, organic light emitting diode display panel, mask plate and display device are provided in the arrangement of the present disclosure. In an arrangement, in the pixel arrangement structure, the first sub-pixels are located at the center position of the first virtual rectangle and the positions of four vertex angles of the first virtual rectangle; the second sub-pixels are located at the center position of the sides of the first virtual rectangle; and the third sub-pixel is located in the second virtual rectangle. The second virtual rectangle are sequentially connected by two second sub-pixels and two first sub-pixels, the two second sub-pixels and the two first sub-pixels are as vertex angles, the two second sub-pixels are located at center position of the adjacent two sides of the first virtual rectangle, and each of the two first sub-pixels is adjacent to each of the two second sub-pixels and one of the two first sub-pixels is located at the center position of the first virtual rectangle and the other is located at a vertex angle position of the first virtual rectangle. And four second virtual rectangles are formed a first virtual rectangle. Compared with the pixel arrangement structure of the related art, such pixel arrangement manner can make the first sub-pixel, the second sub-pixel and the third sub-pixel closely arranged under the same process condition. Thereby under the condition that the minimum sub-pixel interval is satisfied, the area of the single sub-pixel is increased as much as possible, thereby reducing the drive current of the display means and increasing the lifetime of the display means.

Moreover, arranging the third sub-pixel in a long strip shape is beneficial to enlarge the area of the second sub-pixel, thereby the sub-pixel with lower luminous efficiency in the display panel can be set as the second sub-pixel. In addition, the two ends of the long strip are symmetrical designed, which can reduce the pattern complexity of the evaporation mask plate, thereby simplifying the pattern composition process.

Obviously, those skilled in the art can make various changes and modifications to the present disclosure without departing from the spirit and the scope of the present disclosure. Thus, if these changes and the modifications of the present disclosure belong to the scope of the claims of the present disclosure and equivalent technologies thereof, then the present disclosure is also intended to include the changes and the modifications.

What is claimed is:

1. A pixel arrangement structure, comprising:
a plurality of first sub-pixels, a plurality of second sub-pixels, and a plurality of third sub-pixels, wherein:
respective positions of the pluralities of first, second, and third sub-pixels are not overlapped with each other;
one of the plurality of first sub-pixels is located at a center position of a first virtual rectangle, and four of the plurality of first sub-pixels are located at four vertex angle positions of the first virtual rectangle, respectively;
four of the plurality of second sub-pixels are located at center positions of four sides of the first virtual rectangle, respectively;
the first virtual rectangle is divided into four second virtual rectangles, and an inside of each of the four second virtual rectangles comprises one of the plurality of third sub-pixels; and
a first sub-pixel is adjacent to four third sub-pixels, sides of the first sub-pixel facing the four third sub-pixels are respectively concaved in a direction away from the four third sub-pixels, and a shape of each of the four third sub-pixels is configured to protrude in a direction close to a concave side of the first sub-pixel that the third sub-pixels faces.

2. The pixel arrangement structure of claim 1, wherein:
the second virtual rectangles are each formed by sequentially connecting four vertexes of four vertex angles, wherein two of the second sub-pixels and two of the first sub-pixels are respectively located at four vertex angle positions of each of the second virtual rectangles;
the two second sub-pixels are located at center positions of two adjacent sides of the first virtual rectangle;
each of the two first sub-pixels is adjacent to each of the two second sub-pixels; and
one of the two first sub-pixels is located at the center position of the first virtual rectangle and the other is located at a vertex angle position of the first virtual rectangle.

3. The pixel arrangement structure of claim 2, wherein:
a shape of the first sub-pixel is substantially a cruciform;
each inner angle of the first sub-pixel is greater than or equal to 90 degrees;
the cruciform is a shape formed by a concave of a middle of four sides of a quadrilateral, and the four vortex angles of the quadrilateral are at four ends of the cruciform, respectively; and
the quadrilateral is a substantial rhombus or a substantial square.

4. The pixel arrangement structure of claim 1, wherein each of the plurality of third sub-pixels is in a long strip shape, and an extension direction of the long strip shape is a direction away from the center of the first virtual rectangle.

5. The pixel arrangement structure of claim 4, wherein:
the extension direction of each of the third sub-pixels inside the four second virtual rectangles is different;
the extension direction of each of the third sub-pixels inside the four second virtual rectangles is a direction away from the center of the first virtual rectangle and extending to the first sub-pixel located at a vertex of the second virtual rectangle.

6. The pixel arrangement structure of claim 4, wherein the long strip shape is a mirror symmetrical view in a direction perpendicular to the extension direction thereof.

7. The pixel arrangement structure of claim 4, wherein:
the extension directions of the third sub-pixels located in two second virtual rectangles are the same, and the two second virtual rectangles are disposed along a diagonal of the first virtual rectangle;
the first virtual rectangle is provided with a first diagonal line and a second diagonal line;
the third sub-pixels in the two second virtual rectangles which are disposed along the first diagonal line are extended in a direction along the first diagonal line;
the third sub-pixels in the two second virtual rectangles which are disposed along the second diagonal line are extended in a direction along the second diagonal line;
the third sub-pixels in the two second virtual rectangles which are disposed along the first diagonal line are mirrored symmetrically with respect to the second diagonal line; and
the third sub-pixels in the two second virtual rectangles which are disposed along the second diagonal line are mirrored symmetrically with respect to the first diagonal line.

8. The pixel arrangement structure of claim 4, wherein two ends of the long strip shape are circular arcs or polygons that protrude outward from the interior of the long strip shape.

9. The pixel arrangement structure of claim 4, wherein a center of the third sub-pixel located in each second virtual rectangle is located at an intersection of a line connecting centers of the adjacent two first sub-pixels and a line connecting of centers of adjacent two second sub-pixels, the adjacent two first sub-pixels and the adjacent two second sub-pixels are located at the second virtual rectangle where the third sub-pixel located.

10. The pixel arrangement structure of claim 4, wherein:
a first ratio exists between a minimum distance between the opposite sides of the third sub-pixel and the adjacent first sub-pixel, and a minimum distance between the opposite sides of the third sub-pixel and the adjacent second sub-pixel;
a second ratio exists between a minimum distance between the opposite sides of the third sub-pixel and the adjacent first sub-pixel, and a minimum distance between the opposite sides of the first sub-pixel and the adjacent second sub-pixel;
a third ratio exists between a minimum distance between the opposite sides of the third sub-pixel and the adjacent second sub-pixel, and a minimum distance between the opposite sides of the first sub-pixel and the adjacent second sub-pixel; and
the first ratio, the second ratio, and the third ratio are each in a range of 0.8-1.2.

11. The pixel arrangement structure of claim 10, wherein:
the first ratio, the second ratio, and the third ratio are equal;
the ratio of a maximum distance to the minimum distance D1 is in a range of 1-1.5, and the maximum distance is between the opposite sides of the third sub-pixel and the adjacent first sub-pixel; and
the ratio of a maximum distance to the minimum distance D2 is in a range of 1-1.5, and the maximum distance is between the opposite sides of the third sub-pixel and the adjacent second sub-pixel.

12. The pixel arrangement structure of claim 10, wherein the opposite sides of the third sub-pixel and the adjacent first sub-pixels are parallel to each other; and the opposite sides of the third sub-pixel and the adjacent second sub-pixels are parallel to each other.

13. The pixel arrangement structure of claim 1, wherein at least one of a shape of the second sub-pixel and a shape of the first sub-pixel is a substantial rectangle.

14. The pixel arrangement structure of claim 1, wherein:
the first subpixel is a red sub-pixel;
the second sub-pixel is a blue sub-pixel;
the third sub-pixel is a green sub-pixel;
an area of the blue sub-pixel is larger than an area of the red sub-pixel and an area of the green sub-pixel, respectively, wherein:
the area of the blue sub-pixel is larger than the area of the red sub-pixel, and the area of the red sub-pixel is larger than the area of the green sub-pixel; or
the area of the blue sub-pixel is larger than the area of the green sub-pixel, and the area of the green sub-pixel is larger than the area of the red sub-pixel.

15. The pixel arrangement structure of claim 14, wherein at least one of the following conditions are satisfied:
the area of each third sub-pixel is the same, and a shape of each third sub-pixel is the same;
the area of each first sub-pixel is the same, and a shape of each first sub-pixel is the same; and
the area of each second sub-pixel is the same, and a shape of each second sub-pixel is the same.

16. The pixel arrangement structure of claim 14, wherein:
the area of each third subpixel is the same, and a shape of each third sub-pixel is the same;
the area of each first sub-pixel is the same, and a shape of each first sub-pixel is the same; or
the area of each second sub-pixel is the same, and a shape of each second sub-pixel is the same.

17. The pixel arrangement structure of claim 1, wherein a closest distance between the first sub-pixel and each of the four third sub-pixels which are adjacent to the first sub-pixel is approximately the same.

18. An organic light emitting diode display panel, comprising:
a plurality of pixel arrangement structures, the pixel arrangement structures each comprising a plurality of first sub-pixels, a plurality of second sub-pixels, and a plurality of third sub-pixels, wherein:
respective positions of the plurality of first, second, and third sub-pixels are not overlapped with each other;
one of the plurality of first sub-pixels is located at a center position of a first virtual rectangle, and four of the plurality of first sub-pixels are located at four vertex angle positions of the first virtual rectangle, respectively;
four of the plurality of second sub-pixels are located at center positions of four sides of the first virtual rectangle, respectively;
the first virtual rectangle is divided into four second virtual rectangles, and an inside of each of the four second virtual rectangles each comprising one third sub-pixel of the plurality of third sub-pixels;
the adjacent first virtual rectangles are configured to share the first sub-pixels and the second sub-pixels on sides facing each other of the adjacent first virtual rectangles in a row direction and a column direction; and
a first sub-pixel is adjacent to four third sub-pixels, sides of the first sub-pixel facing the four third sub-pixels are respectively concaved in a direction away from the four third sub-pixels, and a shape of each of the four third sub-pixels is configured to protrude in a direction close to a concave side of the first sub-pixel that the third sub-pixels faces.

19. The organic light emitting diode display panel according to claim 18, wherein the organic light emitting diode display panel is part of a display device.

20. A pixel arrangement structure, comprising a plurality of first sub-pixels, a plurality of second sub-pixels, and a plurality of third sub-pixels, wherein:

respective positions of the pluralities of first, second, and third sub-pixels are not overlapped with each other;

one of the plurality of first sub-pixels is located at a center position of a first virtual rectangle, and four of the plurality of first sub-pixels are located at four vertex angle positions of the first virtual rectangle, respectively;

four of the plurality of second sub-pixels are located at center positions of four sides of the first virtual rectangle, respectively;

the first virtual rectangle is divided into four second virtual rectangles, and an inside of each of the four second virtual rectangles comprises one of the plurality of third sub-pixels;

each of the third sub-pixels is configured to extend along an extension direction, and a size of each of the third sub-pixels in the extension direction is greater than a size of each of the third sub-pixels in a direction perpendicular to the extension direction, the extension direction is a direction from a center of the first virtual rectangle to a apex of the first virtual rectangle;

a first ratio exists between a minimum distance D1 and a minimum distance D2, the minimum distance D1 is between opposite sides of a third sub-pixel and an adjacent first sub-pixel, and the minimum distance D2 is between opposite sides of the third sub-pixel and an adjacent second sub-pixel;

a second ratio exists between the minimum distance D1 and a minimum distance D3, the minimum distance D3 is between opposite sides of the first sub-pixel and an adjacent second sub-pixel;

a third ratio exists between the minimum distance D2 and the minimum distance D3; and the first ratio, the second ratio, and the third ratio are each in a range of 0.8-1.2.

\* \* \* \* \*